United States Patent [19]

Benjamin et al.

[11] 4,413,221
[45] Nov. 1, 1983

[54] METHOD AND CIRCUIT FOR DETERMINING BATTERY CAPACITY

[75] Inventors: Fred Benjamin, Fullerton; Robert H. Heil, Harbor City, both of Calif.

[73] Assignee: Christie Electric Corporation, Torrance, Calif.

[21] Appl. No.: 217,897

[22] Filed: Dec. 18, 1980

[51] Int. Cl.³ .......................................... G01R 31/36
[52] U.S. Cl. ...................................... 320/48; 320/14; 324/427; 324/435
[58] Field of Search ................... 320/5, 9–11, 320/13, 14, 20–22, 43, 48; 340/636; 324/426, 427, 429, 433, 435

[56] References Cited

U.S. PATENT DOCUMENTS

| | | | |
|---|---|---|---|
| 3,898,548 | 8/1975 | Perelle et al. | 320/48 |
| 4,027,231 | 5/1977 | Lohrmann | 340/636 X |
| 4,080,560 | 3/1978 | Abert | 324/429 |
| 4,140,958 | 2/1979 | Groeschel | 320/14 |
| 4,234,840 | 11/1980 | Konrad et al. | 340/636 X |
| 4,295,097 | 10/1981 | Thompson et al. | 324/429 |
| 4,302,714 | 11/1981 | Yefsky | 320/48 X |
| 4,321,541 | 3/1982 | Nishizuka | 324/429 |

*Primary Examiner*—A. D. Pellinen
*Attorney, Agent, or Firm*—Christie, Parker & Hale

[57] ABSTRACT

The capacity of a battery is determined while charging the battery by measuring the time it takes the battery voltage to decrease to a selected voltage level during discharging intervals interspersed between charging intervals. The state-of-charge is also determined by measuring the voltage level during a discharge interval while monitoring the duration of the charge cycle. Additionally, faulty cells of the battery are detected by measuring the voltage of the individual cells at the end of a discharging interval during the charging of the battery.

11 Claims, 9 Drawing Figures

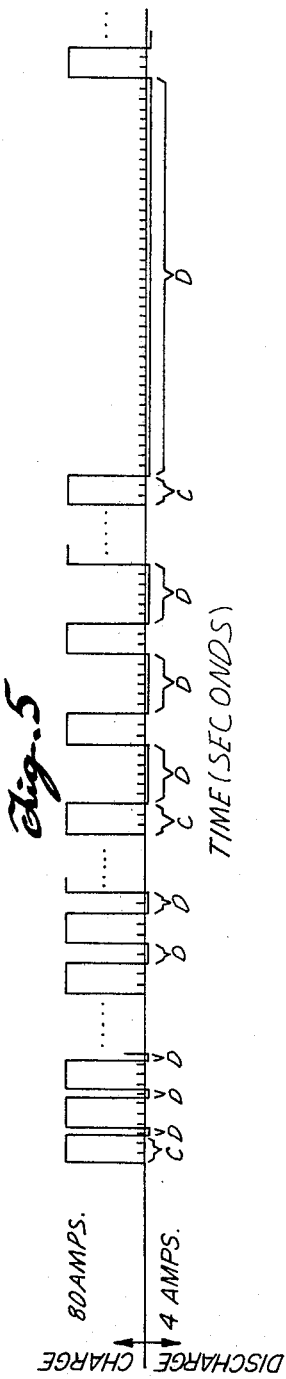
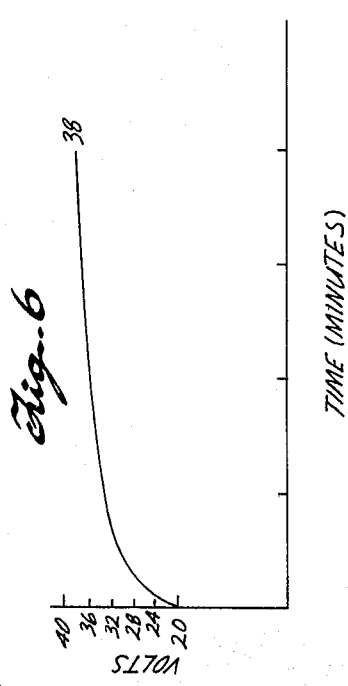
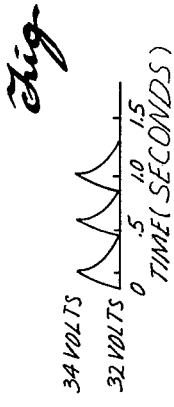
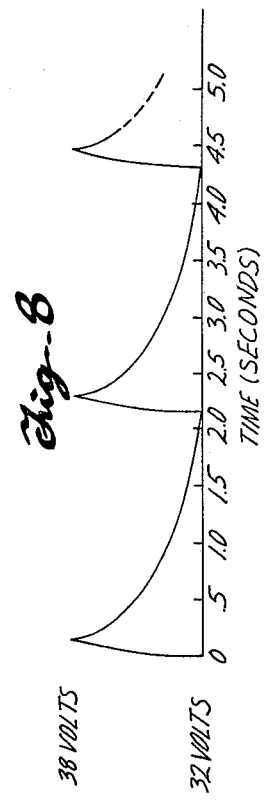
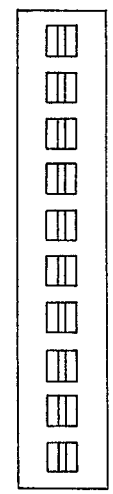

METHOD AND CIRCUIT FOR DETERMINING BATTERY CAPACITY

BACKGROUND OF THE INVENTION

This invention relates to a method and circuit for determining the capacity of a battery and its cells and is particularly adapted to determining the capacity in a minimum amount of time. The time can be further reduced by the state-of-charge reading during charge.

In many applications it is important to know the maximum capacity of a battery as well as the cell capacities because it can, in some instances, be disastrous if the battery fails in operation. One such use of batteries is in the emergency powering of equipment, such as communications systems. Another such use is in the starting and emergency power for aircraft. Typically, vented nickel-cadmium (Ni-Cad) batteries are used for this latter purpose. Such batteries have a long life and may be recharged many times. However, over a period of time one or more cells of the battery may fail or the overall condition may degrade to the point that the maximum or full-charge capacity of the battery is too low or unreliable to be used. The maximum capacity of such batteries is periodically checked to determine if the battery is satisfactory to remain in use or should be replaced.

The known methods and apparatus for analyzing batteries to determine the maximum capacity involve excessively long periods of time. One common approach in analyzing Ni-Cad batteries that are used in aircraft is to first charge the battery and then fully discharge the battery down to a generally accepted full discharge voltage of typically 1 volt average per cell to determine the ampere-hour capacity of the battery to see if this maximum capacity is sufficiently high for the battery to be re-used. This discharge test usually takes about one or two hours. Charging techniques for the charge cycle require anywhere from one hour to four hours or more to charge the battery. Consequently, this process takes at least two hours to determine the capacity of a battery and then at least another hour to recharge the battery if the capacity of the battery is found to be acceptable.

SUMMARY OF THE INVENTION

In accordance with the present invention, the maximum battery capacity and relative cell capacities of a battery are determined during the charging cycle so that only the one charge cycle is required and no one-hour, two-hour or longer, duration discharge cycle is required, nor a second charge cycle.

The method of determining the capacity of a battery in accordance with the present invention comprises the steps of: (a) imposing an increasing charge on the battery during a plurality of charge intervals and a plurality of discharge intervals interspersed with the charging intervals by applying a charge current to the battery during each charge interval, applying a load to the battery during each discharging interval with the duration of the discharge interval being variable and determined by the time it takes the battery terminal voltage to decrease to a selected reference level, and removing the load in response to the attainment of the selected level to end the discharge interval; and (b) measuring the duration of each discharge interval as an indication of the capacity of the battery.

Further in accordance with the present invention, the method includes the steps of applying a shunt in the path of the battery discharge current, developing a signal in response to the voltage across the shunt during each discharge interval with the signal having a duration determined by the duration of the discharge interval, and applying the signal through signal-amplifying and modifying circuits to a bar chart or other type of display for a visual indication of capacity.

In accordance with the present invention, the capacity of a battery is determined in a very short time by employing a battery charger/analyzer comprising means for applying a selected amplitude of charge current to the battery for a selected interval of time, means for discharging the battery at the end of each charge current pulse, means for sensing the battery terminal voltage during discharge, means responsive to the sensing means for terminating the discharging upon reaching a selected battery terminal voltage, means for sensing the duration of time of each discharge interval, and means for displaying this time duration as an indication of the charge capacity of the battery.

Additionally, the circuit means may further comprise means for measuring the voltage of the individual cells of the battery at the end of a discharge interval to determine the relative cell capacities.

BRIEF DESCRIPTION OF THE DRAWINGS

FIG. 5 is a graph of typical interspersed charging and discharging intervals for the charging operation in accordance with the present invention.

FIG. 6 is a curve showing the instantaneous terminal voltage of a battery being charged and analyzed in accordance with the present invention.

FIG. 7 is a curve showing the variations in the instantaneous voltage for a battery having approximately 60% of rated capacity while being charged and analyzed in accordance with the present invention.

FIG. 8 is a curve showing the variations in the instantaneous voltage for a battery having approximately 100% of rated capacity while being charged and analyzed in accordance with the present invention.

FIG. 9 is a representation of the bar graph resulting from the LED displays of the apparatus of FIGS. 1 through 3.

DESCRIPTION OF THE PREFERRED EMBODIMENT

In a majority of the applications where batteries are employed as power sources and the maximum capacity of these batteries is periodically determined to see if the battery should be replaced or recharged, it is desirable to minimize the time required to check the capacity. A schematic diagram of a preferred circuit for charging and analyzing batteries in a minimum amount of time is shown in FIGS. 1, 2 and 3 arranged as shown in FIG. 4.

Figure 1:
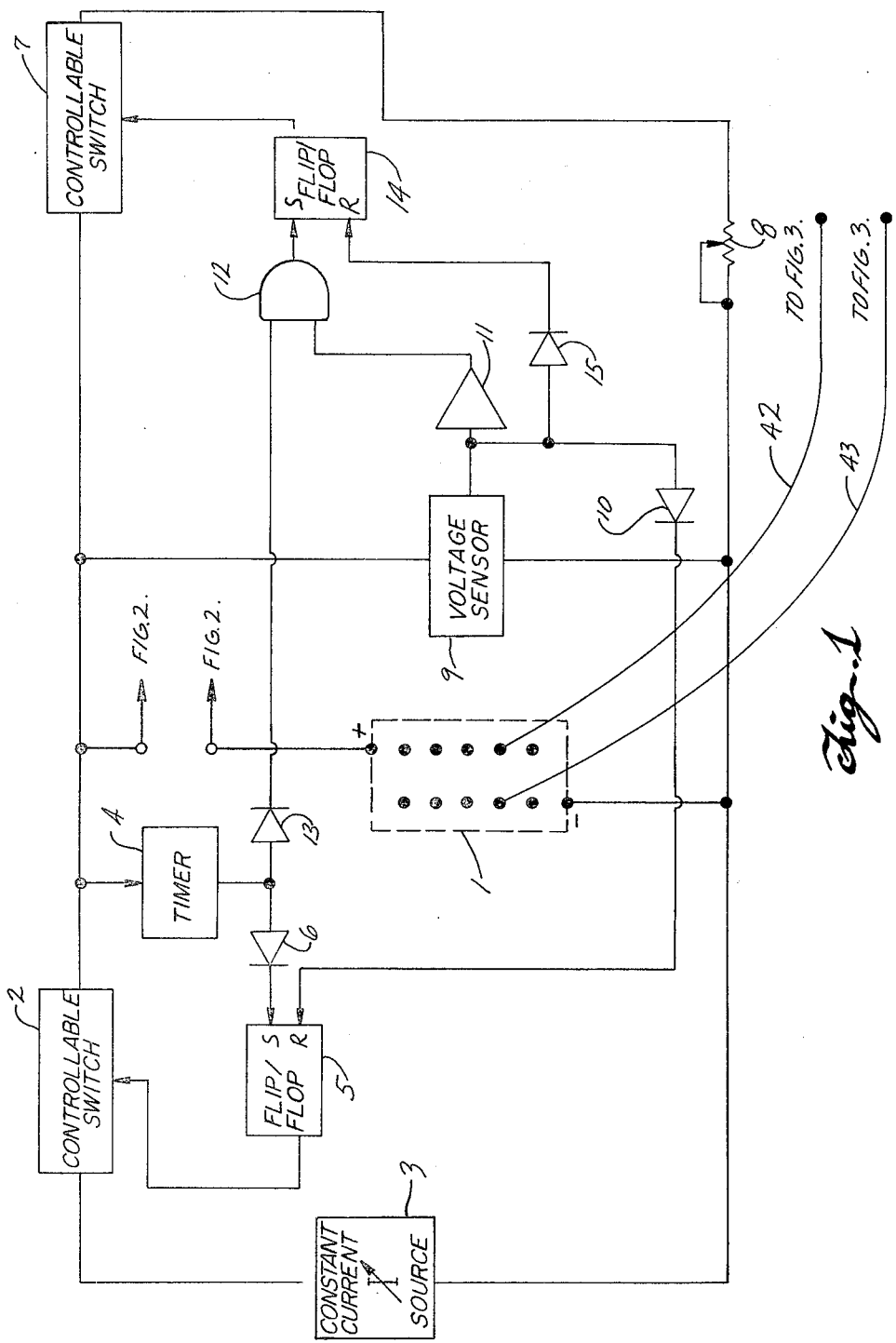
FIGS. 1, 2 and 3 in combination, and placed as shown in FIG. 4, are a block and schematic diagram of an apparatus for charging and analyzing a battery and the relative individual cell capacities in accordance with the present invention.
Figure 2:
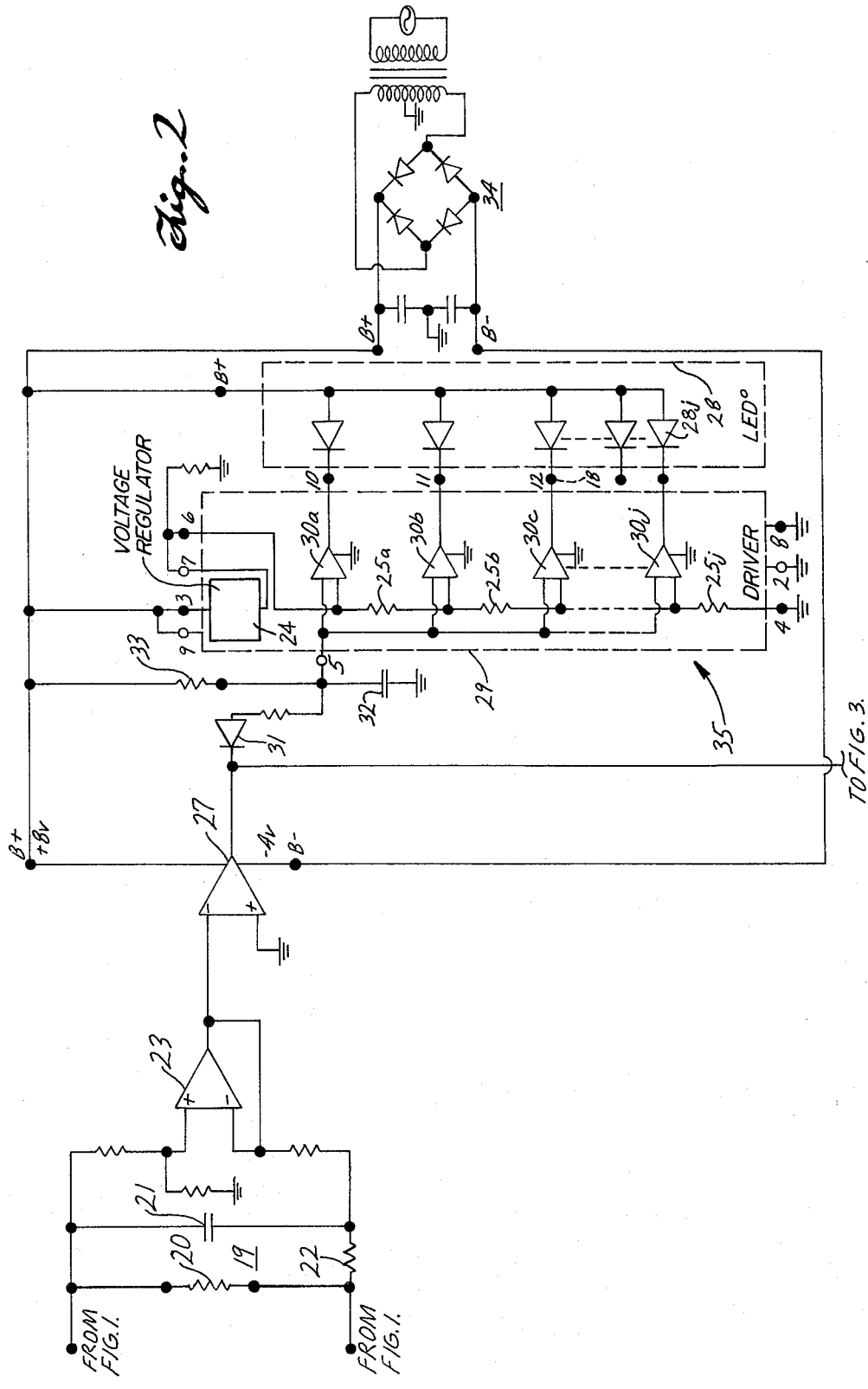
Figure 3:
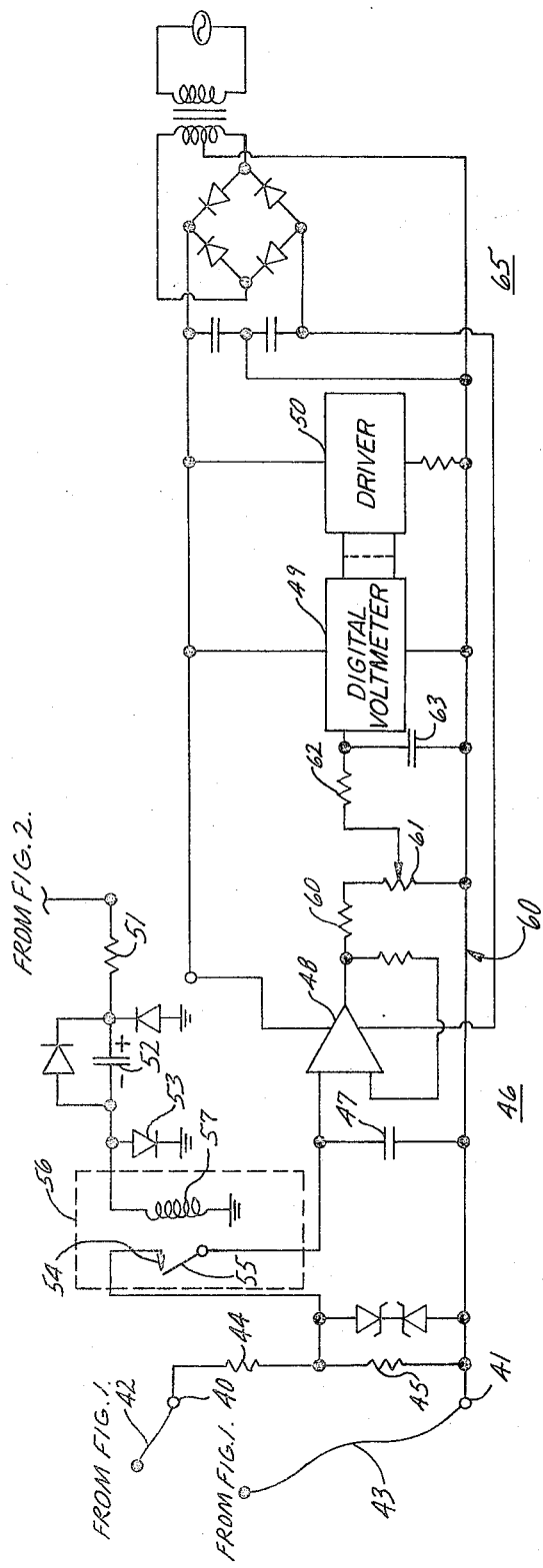
Figure 4:
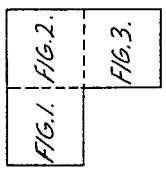

The battery charger/analyzer consists of three sections, viz., a battery charge section shown in FIG. 1, a battery analyzer section shown in FIG. 2, and a relative cell capacity analyzer section shown in FIG. 3. These three sections may be housed in a single housing, or in any combination, or separately in multiple housings. Further, the battery charging section may have a circuit different from that shown in FIG. 1 but, in any event, the charging circuitry for the purposes of this invention provides discharging intervals interspersed with charging intervals. Advantageously, the charger employed is of the rapid charge type where batteries, such as Ni-Cad batteries, can be charged in as little as one hour or less. Such chargers are disclosed in U.S. Pat. Nos. 3,559,025; 3,622,857; and 3,597,673, all of which are assigned to the same assignee as this application. The battery charger shown in FIG. 1 depicts in block and schematic form a charger similar to the Model RF80GT and RF80H Charger/Analyzer for aircraft batteries manufactured and sold by the assignee.

The present invention will be described by using a typical vented Ni-Cad battery used in aircraft as an example, but it is understood to be applicable to the charging and analyzing of any cell or battery employing a plurality of secondary cells that are rechargeable whether by the rapid charging methods and apparatus of the above patents or otherwise.

Vented Ni-Cad batteries used on aircraft typically have from 11 cells to 20 cells in the battery and a rating of 5 to 55 Amp-Hours (A-H). A 20-cell, 40 A-H battery will be used in describing the present invention. In such a battery, the battery terminal voltage when the battery is considered to be discharged is typically 20 volts or less, and when the battery is fully charged is typically at least 28 volts. By employing the method and apparatus to rapidly charge a battery as described in the above patents, Ni-Cad batteries can be charged in approximately one hour as compared to the four or more hours that it takes with other methods and apparatus for charging batteries. Consequently, using such a rapid charger and the old method of determining the capacity of the battery by first charging the battery and then discharging the battery for fixed intervals of time, the testing of a battery and the subsequent recharging took approximately three hours if rapid charging was employed. The capacity of a battery may be determined in less than one hour while the battery is being charged by use of the method and apparatus of the present invention.

The battery charger of FIG. 1 represents in block and schematic form a battery charger for rapidly charging batteries such as vented Ni-Cad batteries, and generally represents the battery chargers disclosed in the above patents and the assignee's RF80GT and RF80H Charger/Analyzers. The battery charger of FIG. 1 applies a high-rate charging current, such as 80 amperes, if charging a 20-cell, 40 A-H vented Ni-Cad battery, for a fixed interval of time, such as 150 milliseconds, interspersed with discharge intervals that commence once the instantaneous battery terminal voltage exceeds a selected value, such as 32 volts. During each discharge interval of the charging cycle, the load applied to the battery draws typically 4 amperes of current for a variable duration of time, which is determined by the time it takes for the instantaneous battery terminal voltage to decrease to a selected level, such as 32 volts for the 20-cell Ni-Cad battery. Typical charging and discharging intervals are shown in the graph of FIG. 5 where 80 amps is used for charging and 4 amps is the discharge current. The base of the graph is time in seconds, and the ordinate is current in amperes.

As charging of the battery progresses, the discharging intervals indicated by the letter "D" on FIG. 5 increase in duration. The charging intervals, indicated by the letter "C" on FIG. 5, are of constant duration and in this example have a time period of 150 milliseconds. The average battery terminal voltage varies during the charging operation from approximately 20 volts for a discharged battery to typically 38 volts for a fully charged battery as shown in the graph of FIG. 6 where voltage in volts is plotted against time in minutes.

By using the rapid charging method and apparatus of the invention and the charge currents and discharge currents depicted on FIG. 5 and a selected reference voltage of 32 volts for terminating the discharge interval, the discharge interval when the battery is charged to its rated maximum capacity approaches 2 seconds. Curves depicting the instantaneous battery voltage during the charging operation where a battery has reached 60% of its rated capacity and 100% of its rated capacity are shown in FIGS. 7 and 8, respectively. In these figures the instantaneous voltage in volts is plotted against time in seconds.

The charger section shown in FIG. 1 generally consists of a first path for applying charging current to the battery and a second path for discharging the battery through a load. The charge path consists of a constant current source 3 and a controllable switch 2 in series with the series combination of a battery 1 and a shunt 20 The discharge path consists of a variable load 8 and a controllable switch 7 connected in series with the series combination of battery 1 and shunt 20. Shunt 20 (FIG. 2) is connected in series with the switch 7 and load 8 relative to the battery to provide an input signal to the analyzer section shown in FIG. 2 during the discharge interval.

The controllable switches 2 and 7 are controlled by digital logic control circuits that establish a fixed interval of time for each charge current pulse and apply the discharge path at the end of the fixed charge current pulse. The control circuits also monitor the instantaneous battery terminal voltage during discharge to terminate each discharge interval when the instantaneous battery terminal voltage decreases to the selected reference level.

The control circuit includes a timer 4 having an input connected to the output of switch 2, and a flip/flop 5 connected between the input to the controllable switch 2 and the output of timer 4 through an isolation diode 6. The control circuit also includes an instantaneous battery voltage sensor 9, an isolation diode 10, an inverter 11, an AND-gate 12, an isolation diode 13, a flip/flop 14, and an isolation diode 15.

The 20-cell, 40 A-H battery is represented by battery 1 in FIG. 1 and is charged through the controllable switch 2 from constant current source 3. The output current from source 3 is selected for charging the particular battery under charge. In this example, source 3 is set at 80 amperes for charging the battery 1. The duration of the charging interval is determined by timing circuit 4 connected at the output of the controllable switch 2. Timer 4 detects the application of a charge current to the battery 1 and thereafter provides an output pulse at the end of the selected interval of time which, in this example, is 150 milliseconds. At the end of the selected fixed interval of time, the output pulse produced by the timer 4 is applied to the set input of flip/flop 5, the NOT output of which is applied as the control signal for the controllable switch 2.

The instantaneous voltage level sensor 9 is connected in series with shunt 20 directly across the battery 1 and is responsive to the instantaneous value of the battery terminal voltage. Sensor 9 functions as a threshold voltage detector and generates an output signal when the instantaneous battery terminal voltage is below a selected level, such as 32 volts for the 20-cell, 40 A-H battery.

The output of sensor 9 is connected through isolation diode 10 to the reset input of flip/flop 5. The output of sensor 9 is also connected through inverter 11 to one input of a two-input AND-gate 12. The other input of AND gate 12 comes from the output of timer 4 through isolation diode 13.

The output of AND-gate 12 is connected to the set input of flip/flop 14. The reset input of flip/flop 14 is connected through isolation diode 15 to the output of sensor 9. The output of flip/flop 14 is connected as the control signal to controllable switch 7.

In operation, upon application of the constant current source 3 to the circuit of FIG. 1, the high-rate charge current begins to flow through controllable switch 2 to initiate the charging of the battery 1. The initiation of the charge current flow is detected by timer 4 which has an output pulse at the end of the selected 150 milliseconds duration. In the initial stages of charging, the instantaneous battery terminal voltage remains below 32 volts so that there is a constant output from sensor 9. This constant output is applied as a logic 1 to the reset input of flip/flop 5 so that a logic 1 appears at the NOT output of flip/flop 5. This 1 appears at the output of flip/flop 5 until the positive output pulse from timer 4 is applied to the set input as a logic 1 to cause the flip/flop 5 to charge state. The NOT output then goes to a logic 0 causing the controllable switch 2 to open to end the charging interval.

At the end of the short output pulse from the timer 4, the flip/flop 5 is reset by the continuous signal from sensor 9 as long as the instantaneous battery voltage remains below the selected level to again close the controllable switch 2 to start another charging interval. The 150-millisecond charging intervals are continuously applied without any varying discharging intervals until the instantaneous battery terminal voltage exceeds the selected level of 32 volts which causes the sensor 9 to no longer have an output at the end of the charging interval.

The removal of the output of sensor 9 upon the instantaneous battery terminal voltage reaching 32 volts causes a logic 1 to appear on the output of inverter 11 so that a logic 1 appears on one input terminal of the AND-gate 12. At the end of the charging interval the positive output pulse from timer 4 is applied through diode 13 to the other input of AND-gate 12 causing a logic 1 to appear at the output of the AND-gate and on the set input to flip/flop 14. The logic 1 causes the flip/flop 14 to change state and a 1 appears at the output of this flip/flop 14. This logic 1 is applied as a control signal to controllable switch 7 to close the switch 7 to start the discharge interval of the charging operation.

The closing of controllable switch 7 applies the variable load 8 across the battery 1 and a selected discharge current is thereby caused to flow from the battery 1 through the variable load 8.

In this example, the impedance value of load 8 is set to allow 4 amperes of current to flow during the discharge interval. The discharge interval continues until the instantaneous battery terminal voltage decreases to 32 volts, thereby causing an output signal to again appear at the output of sensor 9. This signal is applied as a logic 1 through diode 15 to the reset input of flip/flop 14, thereby causing flip/flop 14 to change states. Upon the changing of states of flip/flop 14, the output changes to a logic 0 causing switch 7 to open to end the discharge interval. At the same time the logic 1 output of the sensor 9 is also applied through diode 10 to the reset input of flip/flop 5 to start another charging interval.

When the battery 1 is approximately 60% fully charged, the instantaneous battery terminal voltage varies between 32 volts and 34 volts during interspersed charging and discharging intervals as shown in FIG. 7. As shown in FIG. 7, the instantaneous battery terminal voltage increases from 32 volts to 34 volts during the 150 milliseconds charging interval and decreases from 34 volts to 32 volts in approximately 300 milliseconds during the discharging interval.

As the battery approaches the fully charged state, the instantaneous battery terminal voltage varies between 32 volts and 38 volts as shown in FIG. 8. A good battery will become substantially fully charged after approximately 60 minutes of charging and will have instantaneous terminal voltage variations as shown in FIG. 8. Thus, the discharge interval will have a duration of approximately 2 seconds for a battery having a rated capacity and attaining a full charge.

The analyzing section of the charger/analyzer of the present invention depicted in FIG. 2 includes a shunt 20 for developing the input signal, a filter 19 for removing unwanted signals, an amplifier 23, a comparator 27 for detecting the polarity of the input signal from shunt 20 through amplifier 23 and a bar graph display 35 typically made up of light-emitting diodes (LED's) 28 arranged in a row either horizontally or vertically. The operation of the LED's is controlled by a driver 29 having an input from comparator 27. Preferably, the driver 29 is logarithmically responsive to provide a logarithmic bar chart to indicate the duration of the discharge intervals and the capacity of the battery being charged and analyzed.

The bar chart display that results from ten LED's equally spaced horizontally is depicted by the front on the display of FIG. 9. As more and more LED's are energized in succession the bar moves from left to right across the display of FIG. 9.

The analyzing section further includes a power supply 34 for supplying power for the comparator 27 and LED's 28 and a reference voltage to the driver 29 through a voltage regulator 24 that is part of the driver 29. The output of the comparator 27 is coupled to the input of the driver 29 through a diode 31. A capacitor 32 is connected between the input to driver 29 and ground reference. A resistor 33 is connected between the input to driver 29 and B+ from power supply 34. The signal developed across the shunt 20 is filtered by a capacitor 21 and resistor 22 to remove any unwanted variations in the signal and is thereafter applied to operational amplifier 23. The output of amplifier 23 is applied to comparator 27 which has a selected output voltage level, such as +5 volts, for the duration of each discharging interval.

For charging and analyzing vented Ni-Cad batteries used in aircraft such as the 20-cell, 40 A-H battery of the example, the following components are useful in the analyzing section:

Operational-Amplifier 23—One half of National Semiconductor dual amplifier Model LM1458J
Comparator 27—One half of National Semiconductor dual amplifier Model LM1458J Driver 29—National Semiconductor logarithmic driver Model LM-3915

Display 28—AND, Division of W. J. Purdy 10-segment LED bar graph display Model AND600G The pin connections for a Model LM-3915 driver are shown in FIG. 2. Pin 5 is the input pin, with pins 9 and 3 being connected to B+. A regulated voltage reference appears at pin 7 which is coupled to pin 6 to provide the reference voltage for the resistor divider network 25a through 25j of the driver 29. The other end of the network is coupled to ground reference through pin 4. The resistors 25a through 25j have selected values to provide a logarithmic response across the resistor network. A plurality of threshold detectors 30a to 30j is connected to the voltage divider network so that the individual detectors are connected to progressively higher values of resistance and have higher values of threshold voltage. Detector 30j is responsive to the lowest voltage, while detector 30a is responsive to the greatest voltage, with the detectors in between being responsive to higher values of voltage than detector 30j on a logarithmic basis.

As capacitor 32 charges and the voltage thereacross increases, the voltage level to which threshold detector 30j is sensitive, by virtue of the reference voltage across resistor 25j, is reached and detector 30j changes state and causes LED 28j to be coupled essentially to ground through the detector. This permits current to flow through LED 28j and this diode to emit light. As the capacitor 32 continues to charge, successive detectors change state to light additional LED's 28. As a result, a bar chart display of energized LED's is created with the length of the chart being related to the duration of a discharge interval to indicate the state of charge and capacity of the battery.

It is also useful to determine the relative cell capacities during charge so that if the battery has low capacity, it readily pinpoints which cells need to be replaced. In the present example where the battery is discharged to the selected reference level of 32 volts, cells that have the same capacity as the battery as a whole would read 1.6 volts. Cells with less capacity would read less, cells with more capacity would read more. The section of the battery/charger analyzer used in determining relative cell capacity is shown in FIG. 3. This circuitry is operated under the control of the output signal of comparator 27 of the charger/analyzer section of the analyzer shown in FIG. 2.

The relative cell capacity analyzing circuit includes two input terminals 40 and 41 connected to leads 42 and 43 that may be selectively coupled across cells of the battery 1 under charge, as shown in FIG. 1. The input voltage across terminals 40 and 41 is divided by a voltage divider network consisting of resistors 44 and 45 connected across terminals 40 and 41. The voltage across resistor 45 is applied to a sample-and-hold circuit 46 consisting of a capacitor 47 and an isolation amplifier 48. The isolation amplifier 48 may be a BIMOS amplifier CA81E manufactured by RCA Corporation. This amplifier 48 is a high-input impedance amplifier that isolates a digital voltmeter 49 from the capacitor 47 to prevent loading of the capacitor 47.

Capacitor 47 is connected across resistor 45 through contacts 54 and 55 of a relay 56 which is reponsive to the output of comparator 27 (FIG. 2) and, thereby, the end of each discharge interval.

The winding 57 of relay 56 is connected between ground reference and the output of comparator 27 through a capacitor 52 and resistor 51 in series. A diode 53 is connected across the winding 57 for bypassing the winding during charge of the capacitor 52.

The output of isolation amplifier 48 is divided down by a voltage divider of resistor 60 and potentiometer 61 connected in series between the output of amplifier 48 and the common 60 of the analyzing circuit. The variable arm of potentiometer 61 is coupled through a resistor 62 to the input of digital display voltmeter 49. A capacitor 63 is connected between common 60 and the input to voltmeter 49.

A power supply 65 provides the operating voltages for the relative cell capacity analyzer of FIG. 3.

The digital voltmeter 49 is driven by a driver 50 and displays the voltage level of each cell as it is measured. The digital voltmeter 49 consists of an LED display and may be a 3½ digital display made up of a General Instruments Corporation Model No. MAN6730 and Model MAN6710 1-½ and 2-digit display. The driver 50 may be a 1CL7107CPL driver manufactured by Intersil.

The relative cell capacity circuit reads and locks on to the instantaneous trough voltage of the measured cell at the same point in every cycle. This is accomplished by controlling the operation of the circuit by the signal at the output of comparator 27 which occurs at the end of a discharge cycle. The output of comparator 27 is coupled through resistor 51 to charge capacitor 52 through diode 53. During a discharge interval, the voltage of the output of comparator 27 is +5 volts so that capacitor 52 charges towards this +5 volts through capacitor 52 and diode 53.

The circuit of FIG. 3 measures the voltage of the individual cells near the trough voltage of each cell under the control of the analyzing portion of the battery/charger analyzer. In operation, while a battery is being charged, the cables 42 and 43 are connected to individual cells in succession to measure the cell voltage. This voltage appears across capacitor 47 almost instantaneously upon the closing of relay contacts 54 and 55. These relay contacts are closed at the end of each discharge interval so that the cell voltage that is measured is essentially the trough voltage of the cell at the time the instantaneous battery terminal voltage is 32 volts, which is the trough voltage of the battery that is sensed for terminating the discharge interval. At the end of a discharge interval, the voltage at the output of comparator 27 goes from +5 volts to −5 volts, thereby permitting the capacitor 52 to discharge, with the discharge path including the relay winding 57 to cause the relay 56 to operate. The discharge path from the capacitor 52 is through the comparator 27, power supply 34, ground common, and relay winding 57.

The voltage that appears across capacitor 47 is buffered by isolation amplifier 48 and is read out on the digital display meter 49. Thus, what is displayed on meter 49 is the trough voltage, which corresponds to capacity of the cell being tested under load, so that cells having an above-average or below-average voltage (i.e., capacity) can be detected. If the cell voltage is too far out of line, indicating a defective cell, it need be replaced.

The state-of-charge of the battery may be efficiently determined by the method and apparatus of this invention. With most good low impedance aircraft Ni-Cads, all 10 green bars will light every second just prior to the conclusion of 60 minutes reflex charge. If on the other hand, only 6 bars light after one hour of reflex charge, such a battery may not be fully charged. It might be a battery which actually is capable of 130% rated capacity and may therefore require additional charge. However, if additional bars do not light after a few minutes extra charge—and it is a relatively cool low impedance battery—then it is a battery which probably will fail the conventional capacity discharge test.

Various changes may be made in the details of construction without departing from the spirit and scope of the invention as defined by the appended claims.

What is claimed is:

1. A method of determining the capacity of a battery comprising the steps of:

imposing an increasing charge on a battery during a plurality of charge intervals and a plurality of discharge intervals interspersed with the charge intervals by applying a charge current to the battery during each charge interval;

applying a load to the battery during each discharge interval until the battery voltage decreases to a selected level;

removing the load in response to the attainment of the selected level to end the discharge interval; and sensing the duration of each discharge interval as an indication of the capacity of the battery.

2. A method in accordance with claim 1 further comprising the step of displaying the sensed duration as a bar chart having a length indicating the capacity of the battery.

3. A method in accordance with claim 2 wherein the bar chart has a logarithmic time base.

4. A method in accordance with claim 1 wherein the charge current has a fixed duration and a fixed amplitude.

5. A method of determining the capacity of a battery comprising the steps of:

imposing an increasing charge on a battery during a plurality of charge intervals and a plurality of discharge intervals interspersed with the charge intervals by applying a charge current to the battery during each charge interval;

applying a load to the battery during each discharge interval until the battery voltage decreases to a selected level;

removing the load in response to the attainment of the selected level to end the discharge interval; and measuring the cell trough voltage at the end of the battery discharge interval of each individual cell in succession.

6. The method of determining the capacity of a battery in accordance with claim 5 comprising the further steps of:

applying a portion of the cell voltage to a sample-and-hold circuit at the end of each discharge interval; and displaying the cell voltage on a meter.

7. A method of determining the capacity of a battery comprising the steps of:

imposing an increasing charge on a battery during a plurality of charge intervals and a plurality of discharge intervals interspersed with the charge intervals by applying a charge current to the battery during each charge interval;

applying a load to the battery during each discharge interval until the battery voltage decreases to a selected level;

removing the load in response to the attainment of the selected level to end the discharge interval;

applying a shunt in the path of the battery discharge current;

developing a signal in response to the voltage across the shunt during each discharge interval with the signal having a duration determined by the duration of the discharge interval; and applying the signal to a bar chart display.

8. A method in accordance with claim 7 wherein the bar chart display is made up of a plurality of light-emitting diodes driven from a voltage divider network wherein the value of the resistors of the network has a logarithmic relationship.

9. A battery charger analyzer comprising:

a charge current source;

means for applying a selected amplitude of charge current from the source to a battery for a selected interval of time;

means for discharging the battery at the end of each charge current interval;

means for sensing the battery terminal voltage during discharge;

means responsive to the sensing means for terminating each discharge interval upon the battery terminal voltage decreasing to a selected level;

means for sensing the duration of each discharge interval; and means for displaying this duration as a measure of the charge capacity of the battery.

10. A battery charger analyzer in accordance with claim 9 wherein the display means is a bar chart made up of light-emitting diodes driven by a driver having a voltage divider network with a logarithmic relationship.

11. A battery charger analyzer in accordance with claim 9 further comprising means for measuring the trough voltage of the individual cells of the battery.

* * * * *